United States Patent
Kato et al.

(10) Patent No.: US 8,921,924 B2
(45) Date of Patent: Dec. 30, 2014

(54) SEMICONDUCTOR MEMORY DEVICE

(71) Applicant: Kabushiki Kaisha Toshiba, Minato-ku (JP)

(72) Inventors: Yoshiko Kato, Kanagawa-ken (JP); Tatsuya Kato, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/939,375

(22) Filed: Jul. 11, 2013

(65) Prior Publication Data

US 2014/0284684 A1   Sep. 25, 2014

Related U.S. Application Data

(60) Provisional application No. 61/803,509, filed on Mar. 20, 2013.

(51) Int. Cl.
    *H01L 29/792* (2006.01)
(52) U.S. Cl.
    CPC .................................. *H01L 29/792* (2013.01)
    USPC .................................. 257/324; 257/E29.309
(58) Field of Classification Search
    CPC ............... H01L 27/11563; H01L 27/11565; H01L 27/1157; H01L 27/11573; H01L 27/11575; H01L 27/11519; H01L 27/11521; H01L 27/11524; H01L 27/11526; H01L 27/11529; H01L 27/11531; H01L 27/11548
    See application file for complete search history.

(56) References Cited

U.S. PATENT DOCUMENTS

| | | | |
|---|---|---|---|
| 7,169,670 B2 | 1/2007 | Lee et al. | |
| 7,696,581 B2* | 4/2010 | Park | 257/374 |
| 8,044,513 B2* | 10/2011 | Endo | 257/758 |
| 8,232,608 B2 | 7/2012 | Kato et al. | |
| 8,373,216 B2* | 2/2013 | Chakihara et al. | 257/298 |
| 2005/0093047 A1* | 5/2005 | Goda et al. | 257/300 |
| 2009/0203186 A1* | 8/2009 | Sakagami | 438/423 |
| 2011/0254073 A1* | 10/2011 | Takekida | 257/316 |

FOREIGN PATENT DOCUMENTS

| | | |
|---|---|---|
| JP | 2000-236073 | 8/2000 |
| JP | 2010-165849 | 7/2010 |

* cited by examiner

*Primary Examiner* — Benjamin Sandvik
(74) *Attorney, Agent, or Firm* — Oblon, Spivak, McClelland, Maier & Neustadt, L.L.P.

(57) ABSTRACT

According to one embodiment, a semiconductor memory device includes a semiconductor substrate, a cell transistor, an extraction section, a guard ring, a first transistor, and a second transistor. The semiconductor substrate includes first, second, third, and fourth regions. The fourth region includes first and second portions. The cell transistor is provided on the first region and includes a first insulating film, a charge storage film, and a first electrode. The extraction section is provided on the second region and includes a second insulating film, and an extension electrode. The guard ring is provided on the third region and includes a third insulating. The first transistor is provided on the first portion and includes a fourth insulating, and a second electrode. The second transistor is provided on the second portion and includes a fifth insulating film, and a third electrode.

20 Claims, 9 Drawing Sheets

SEMICONDUCTOR MEMORY DEVICE

CROSS-REFERENCE TO RELATED APPLICATIONS

This application is based upon and claims the benefit of priority from U.S. Provisional Patent Application 61/803,509, filed on Mar. 20, 2013; the entire contents of which are incorporated herein by reference.

FIELD

Embodiments described herein relate generally to a semiconductor memory device.

BACKGROUND

A semiconductor memory device is provided with a cell region for storing data and a peripheral region provided around the cell region. For instance, the cell region of a NAND flash memory is provided with a memory array in which a plurality of memory cells are arranged like a matrix. The peripheral region of the NAND flash memory is provided with a row decoder for supplying a driving voltage to a word line of the memory array, and a sense amplifier, which is a circuit for reading data from a memory cell. In semiconductor memory devices, there is an increasing demand for miniaturization of the cell region and the peripheral region.

DETAILED DESCRIPTION

Figure 1:
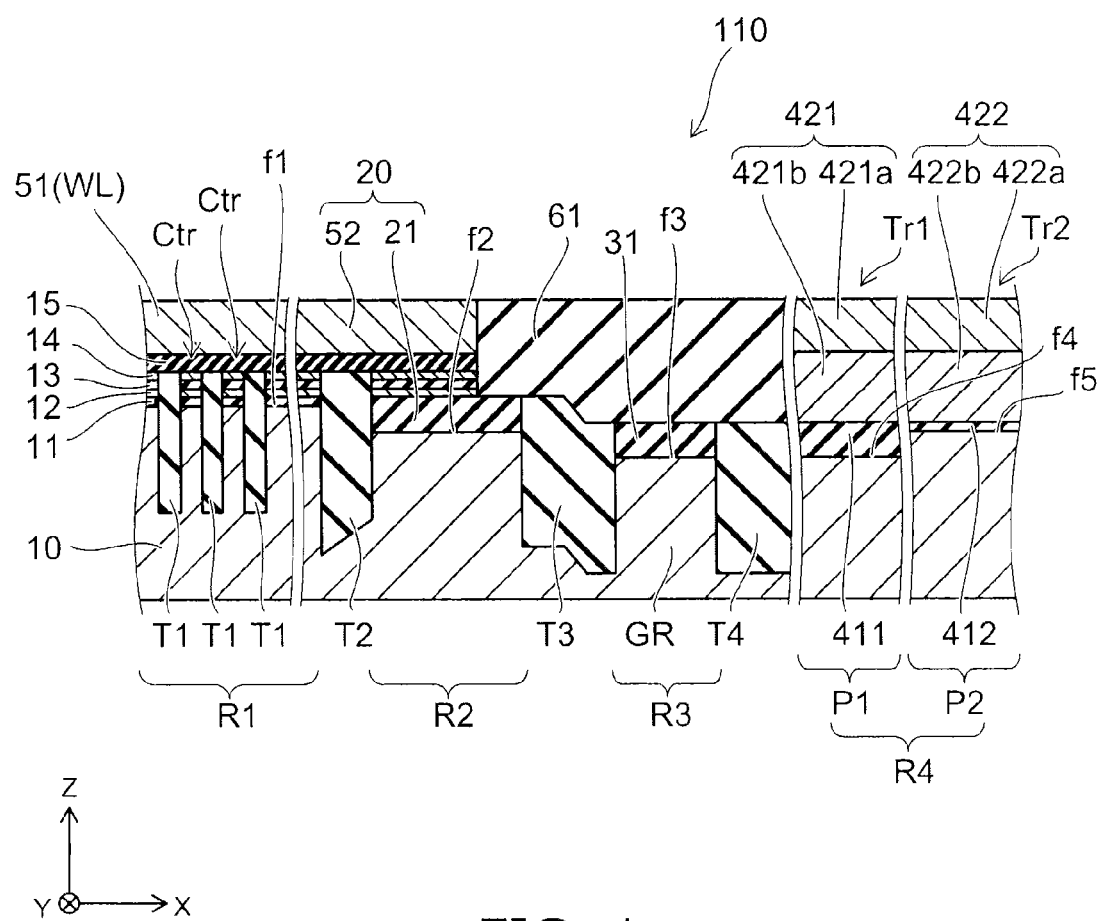
FIG. 1 is a schematic cross-sectional view illustrating a semiconductor memory device according to a first embodiment.

According to one embodiment, a semiconductor memory device includes a semiconductor substrate, a cell transistor, an extraction section, a guard ring, a first transistor, and a second transistor. The semiconductor substrate includes a first region, a second region, a third region, and a fourth region. The second region is provided between the first region and the third region. The third region is provided between the second region and the fourth region. The fourth region includes a first portion and a second portion. The cell transistor is provided on the first region. The cell transistor includes a first insulating film having a first film thickness, a charge storage film provided on the first insulating film, and a first electrode provided on the charge storage film. The extraction section is provided on the second region. The extraction section includes a second insulating film having a second film thickness thicker than the first film thickness, and an extension electrode provided on the second insulating film, being continuous with the first electrode, and extending from above the first region to above the second region. The guard ring is provided on the third region. The guard ring includes a third insulating film having a third film thickness thicker than the first film thickness. The first transistor is provided on the first portion and includes a fourth insulating film having a fourth film thickness thicker than the first film thickness, and a second electrode provided on the fourth insulating film. The second transistor is provided on the second portion and includes a fifth insulating film having a fifth film thickness thinner than the fourth film thickness, and a third electrode provided on the fifth insulating film.

Various embodiments will be described hereinafter with reference to the accompanying drawings. In the following description, like members are labeled with like reference numerals, and the description of the members once described is omitted appropriately.

First Embodiment

FIG. 1 is a schematic sectional view illustrating a semiconductor memory device according to a first embodiment.

Figure 2:
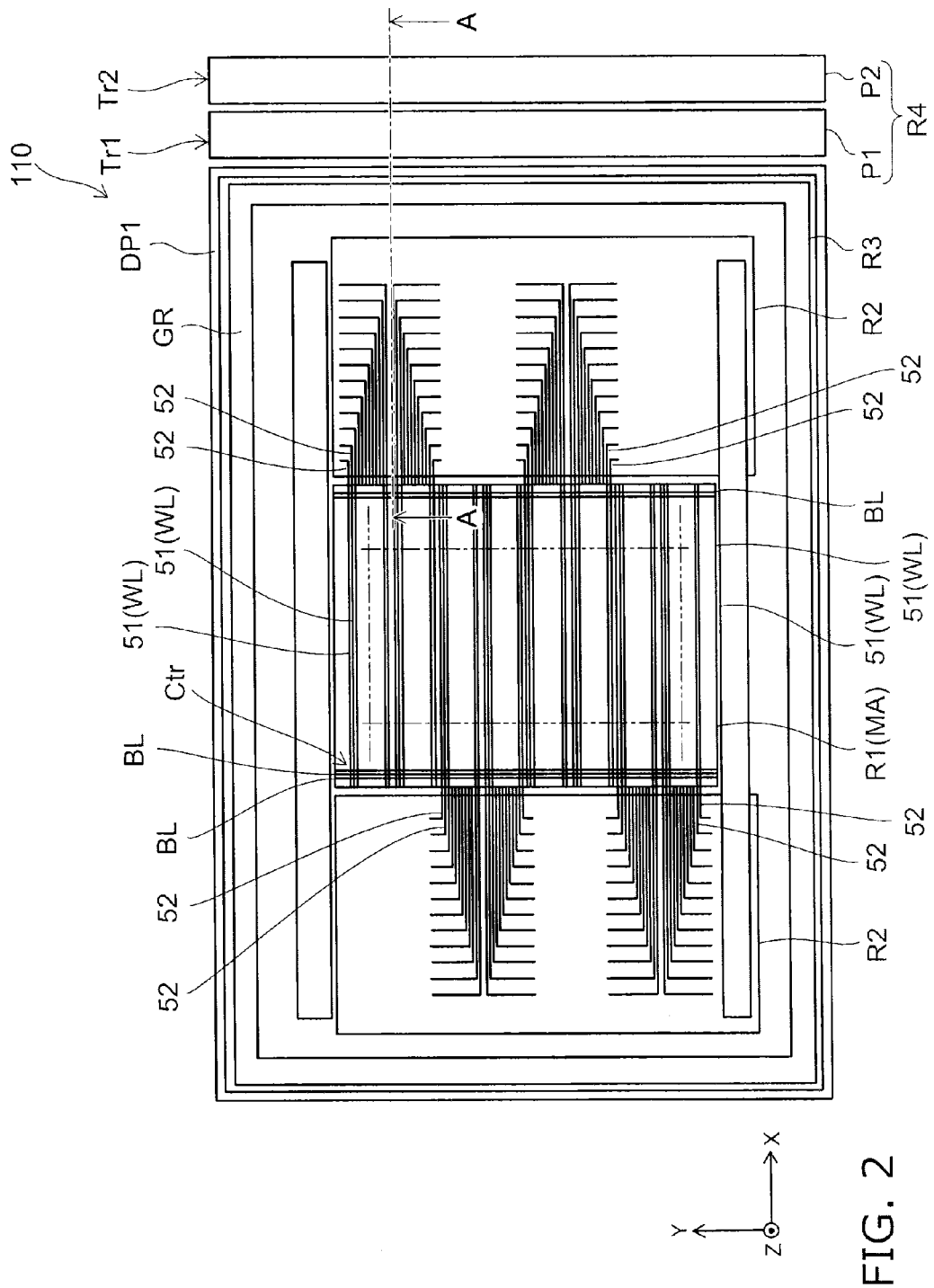
FIG. 2 is a schematic plan view illustrating the semiconductor memory device according to the first embodiment.

FIG. 2 is a schematic plan view illustrating the semiconductor memory device according to the first embodiment.

Figure 3:
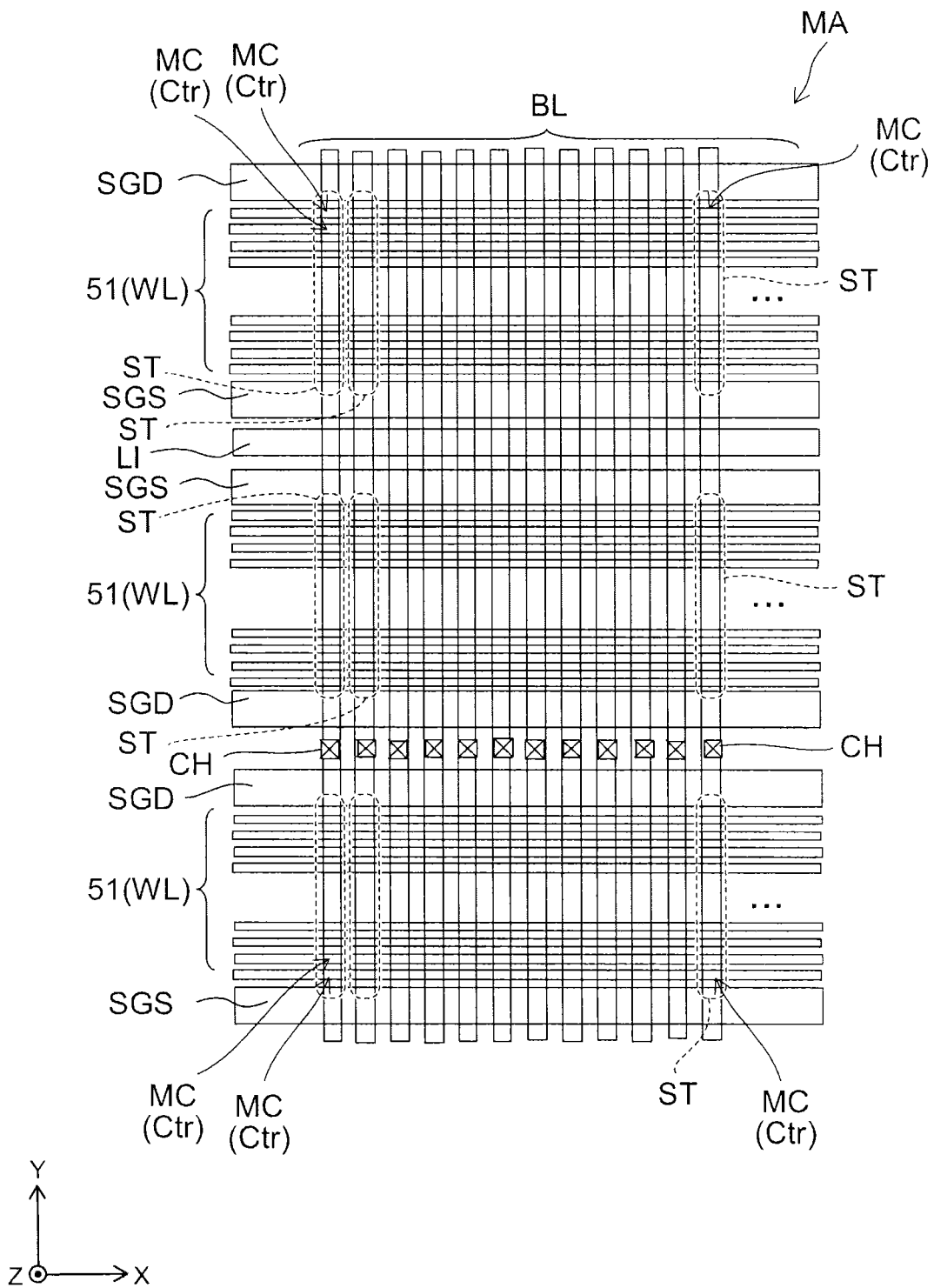
FIG. 3 is a schematic plan view enlarging the memory cell region.

FIG. 3 is a schematic plan view enlarging the memory cell region.

Figure 4:
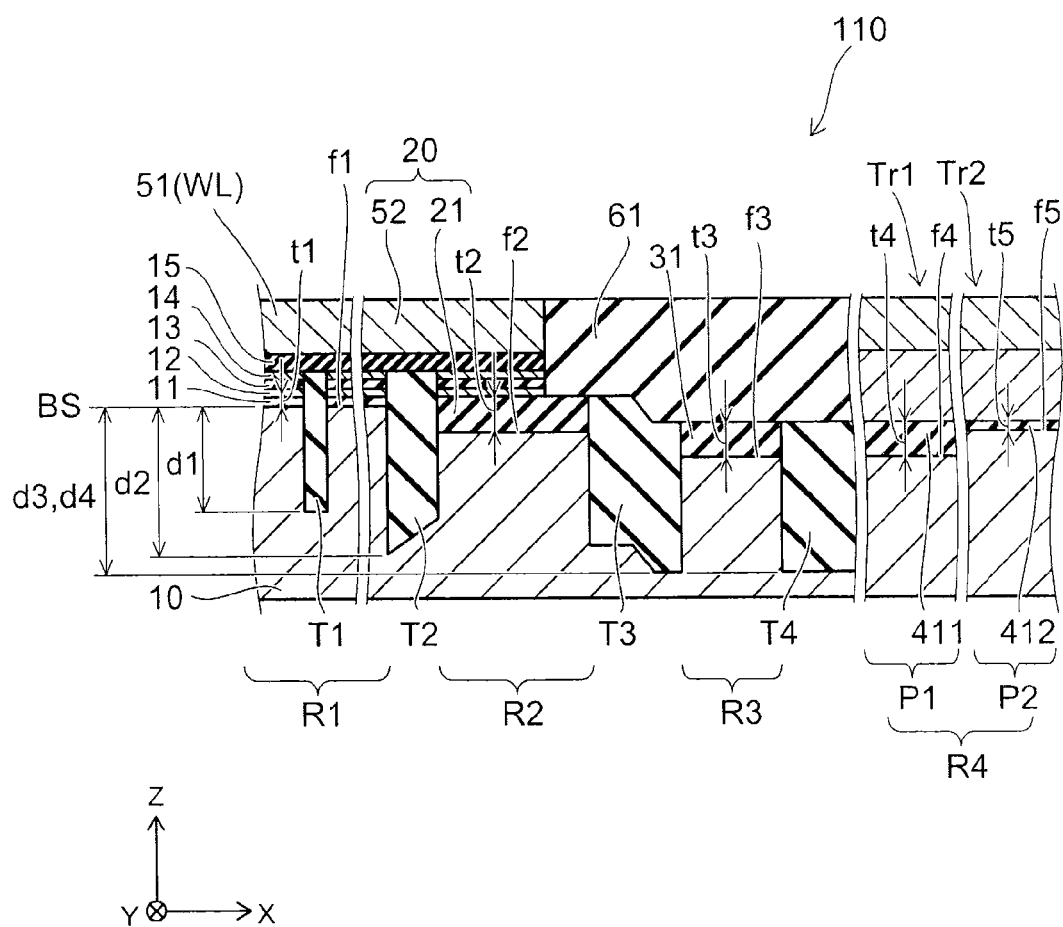
FIG. 4 is a schematic sectional view illustrating a part of the semiconductor memory device.

FIG. 4 is a schematic sectional view illustrating a part of the semiconductor memory device.

The schematic sectional view shown in FIG. 1 is taken along line A-A shown in FIG. 2.

As shown in FIGS. 1 and 2, the semiconductor memory device 110 according to the first embodiment includes a semiconductor substrate 10, a cell transistor Ctr, an extraction section 20, a guard ring GR, a first transistor Tr1, and a second transistor Tr2. The semiconductor memory device 110 is e.g. a NAND flash memory.

The semiconductor substrate 10 has a first region R1, a second region R2, a third region R3, and a fourth region R4. The semiconductor substrate 10 includes e.g. silicon (Si). The semiconductor substrate 10 may be a Si wafer. The first region R1 has a first surface f1. In this embodiment, the direction orthogonal to the surface (first surface f1) of the semiconductor substrate 10 is referred to as Z direction. One of the directions orthogonal to the Z direction is referred to as X direction. The direction orthogonal to the X direction and the Z direction is referred to as Y direction.

The first region R1 is a region provided with a memory array MA. As shown in FIG. 3, the memory array MA is provided with a plurality of memory cells MC. The memory array MA is provided with a plurality of word lines WL extending in the X direction, and a plurality of bit lines BL extending in the Y direction. At the intersection position of each of the plurality of word lines WL and each of the plurality of bit lines BL, a memory cell MC is provided. The cell transistor Ctr is provided in each of the plurality of memory cells MC.

A prescribed number of word lines WL are grouped into a group. At both ends in the Y direction of a group of word lines WL, select gate electrodes SGD and SGS each extending in the X direction are provided. Between the select gate electrode SGD and the select gate electrode SGS, a plurality of memory cells MC on one row provided in the Y direction constitute one memory string ST. In one memory string ST, a plurality of cell transistors Ctr are connected in series. The bit line BL is made continuous with the semiconductor substrate 10 in the first region R1 through a contact hole CH.

Between two adjacent memory strings ST, as shown in FIG. 1, a first device isolation section T1 is provided. The first device isolation section T1 is made of e.g. silicon oxide (SiO$_2$). In the first region R1, a plurality of first device isolation sections T1 are provided. The plurality of first device isolation sections T1 each extend in the Y direction. The plurality of first device isolation sections T1 are provided with a prescribed spacing in the X direction. As shown in FIG. 4, the first device isolation section T1 has a first depth d1 in the Z direction as viewed from a prescribed reference position BS on the semiconductor substrate 10. The reference position BS is e.g. a position in the Z direction of the surface (first surface f1) of the semiconductor substrate 10 in the first region R1. For instance, the first depth d1 is the depth at the deepest position of the first device isolation section T1.

The cell transistor Ctr has a first insulating film 11, a charge storage film 12 provided on the first insulating film 11, and a first electrode 51 provided on the charge storage film 12. The first insulating film 11 has a first film thickness t1. The first insulating film 11 is e.g. a tunnel insulating film of the memory cell. The first insulating film 11 is made of e.g. SiO$_2$. The first film thickness t1 is e.g. approximately 4 nanometers (nm) or more and 8 nm or less. The tunnel insulating film is a film passing a tunnel current upon application of a prescribed voltage.

The charge storage film 12 functions as a floating gate electrode. More specifically, by voltage applied from the first electrode 51, storage of charge into the charge storage film 12 and release of charge from the charge storage film 12 are controlled. The charge storage film 12 is made of e.g. polysilicon doped with impurity. As shown in FIG. 3, the plurality of cell transistors Ctr are arranged like a matrix in the X direction and the Y direction.

The first electrode 51 functions as a word line WL. The first electrode 51 is made of e.g. tungsten (W), or a stacked film of W and tungsten nitride (WN). Between the first electrode 51 and the charge storage film 12, an intergate insulating film 15 is provided. Between the intergate insulating film 15 and the charge storage film 12, an intermediate insulating film 13 is provided. That is, the charge storage film 12 is provided between the first insulating film 11 and the intermediate insulating film 13. A charge trap film 14 may be provided between the intermediate insulating film 13 and the intergate insulating film 15. The charge trap film 14 performs trapping from or detrapping to the substrate, thereby writing or erasing information.

The second region R2 is provided between the first region R1 and the third region R3. As shown in FIG. 2, the second region R2 may be provided on e.g. both sides in the X direction of the first region R1. On the second region R2, the extraction section 20 is provided. The extraction section 20 has a second insulating film 21 and an extension electrode 52.

The second insulating film 21 has a second film thickness t2. The second film thickness t2 is thicker than the first film thickness t1. The second film thickness t2 is e.g. approximately 30 nm or more and 50 nm or less. The second insulating film 21 is made of e.g. SiO$_2$. Because the second film thickness t2 is thicker than the first film thickness t1, the breakdown voltage of the extraction section 20 is increased.

The extension electrode 52 is made continuous with the first electrode 51. The extension electrode 52 has a portion provided above the second insulating film 21 and extending in the X direction. The extension electrode 52 extends out from above the first region R1 to above the second region R2. That is, the extension electrode 52 is an extraction electrode of the word line WL constituting the first electrode 51. The material of the extension electrode 52 may be the same as the material of the first electrode 51. That is, a portion of the first electrode 51 extended out in the X direction may be used as the extension electrode 52.

Between the first region R1 and the second region R2, a second device isolation section T2 is provided. The second device isolation section T2 isolates the first region R1 from the second region R2. The second device isolation section T2 is made of e.g. SiO$_2$. The second device isolation section T2 has a second depth d2 in the Z direction as viewed from the reference position BS. For instance, the second depth d2 is the depth at the deepest position of the second device isolation section T2. The second depth d2 is deeper than the first depth d1. The second device isolation section T2 is formed deeper than the first device isolation section T1.

On the third region R3, a third insulating film 31 is provided. The third insulating film 21 has a third film thickness t3. The third film thickness t3 is thicker than the first film thickness t1. The third film thickness t3 is e.g. approximately 30 nm or more and 50 nm or less. The third film thickness t3 may be substantially equal to the second film thickness t2. In this embodiment, "substantially" means allowing a manufacturing error, let alone complete equality. The third insulating film 31 is made of e.g. SiO$_2$.

In the third region R3, the guard ring GR is provided. As shown in FIG. 2, the guard ring GR is provided so as to surround a region including the first region R1 and the second region R2. The substrate surface side of the guard ring GR contains more impurity than the first region R1 and the second region R2. The guard ring GR plays the role of capturing minority carriers. The guard ring GR prevents latch-up. The guard ring GR also reduces noise.

For instance, the guard ring GR captures electrons causing noise, and suppresses the variation of the substrate potential. This serves to stabilize the operation of the cell transistor Ctr. It is noted that the number of guard rings GR is not limited to one. A plurality of guard rings GR may be provided.

Between the second region R2 and the third region R3, a third device isolation section T3 is provided. The third device isolation section T3 isolates the second region R2 from the third region R3. The third device isolation section T3 is made of e.g. SiO$_2$. The third device isolation section T3 has a third depth d3 in the Z direction as viewed from the reference position BS. For instance, the third depth d3 is the depth at the deepest position of the third device isolation section T3. The third depth d3 is deeper than the second depth d2. The third device isolation section T3 is formed deeper than the second device isolation section T2. The depth of the third device isolation section T3 is deeper on the third region R3 side than on the second region R2 side. The upper surface of the third device isolation section T3 is set back further on the third region R3 side than on the second region R2 side.

The fourth region R4 is a region provided with the peripheral circuit. The peripheral circuit includes a circuit for driving the memory cells MC of the memory array MA. The peripheral circuit includes e.g. a row decoder and a sense amplifier.

The row decoder supplies a driving voltage to the word line WL. The driving voltage is a voltage at several levels, including a write voltage for injecting electrons into the charge storage film 12 of the cell transistor Ctr, a read voltage for detecting the threshold of the cell transistor Ctr, and an erase voltage for extracting electrons from the charge storage film 12. The driving voltage is a voltage typically higher than the voltage for driving the sense amplifier.

The sense amplifier is a circuit for reading data from the memory cell MC of the memory array MA. The sense amplifier is based on a low breakdown voltage transistor to which high voltage is not applied.

The fourth region R4 has a first portion P1 and a second portion P2. On the first portion P1, the first transistor Tr1 is provided. The first transistor Tr1 is e.g. a high breakdown voltage transistor included in the row decoder.

The first transistor Tr1 includes a fourth insulating film 411 and a second electrode 421. The fourth insulating film 411 is provided on the first portion P1. The fourth insulating film 411 has a fourth film thickness t4. The fourth film thickness t4 is thicker than the first film thickness t1. The fourth film thickness t4 is e.g. approximately 30 nm or more and 50 nm or less. This increases the breakdown voltage of the first transistor Tr1. The fourth film thickness t4 may be substantially equal to the second film thickness t2. The fourth film thickness t4 may be substantially equal to the third film thickness t3. The fourth insulating film 411 is made of e.g. $SiO_2$.

The second electrode 421 includes a first conductive film 421a, and a second conductive film 421b provided between the first conductive film 421a and the fourth insulating film 411. The material and film thickness of the first conductive film 421a may be the same as the material and film thickness of the first electrode 51. The second conductive film 421b is made of e.g. polysilicon doped with impurity. The thickness of the second conductive film 421b is e.g. approximately 30 nm or more and 100 nm or less.

On the second portion P2, the second transistor Tr2 is provided. The second transistor Tr2 is e.g. a low breakdown voltage transistor included in the sense amplifier.

The second transistor Tr2 includes a fifth insulating film 412 and a third electrode 422. The fifth insulating film 412 is provided on the second portion P2. The fifth insulating film 412 has a fifth film thickness t5. The fifth film thickness t5 is thinner than the fourth film thickness t4. The fifth film thickness t5 is e.g. approximately 6 nm or more and 9 nm or less. The fifth film thickness t5 may be substantially equal to the first film thickness t1. The fifth insulating film 412 is made of e.g. $SiO_2$.

The third electrode 422 includes a third conductive film 422a, and a fourth conductive film 422b provided between the third conductive film 422a and the fifth insulating film 412. The material and film thickness of the third conductive film 422a may be the same as the material and film thickness of the first electrode 51. The fourth conductive film 422b is made of e.g. polysilicon doped with impurity. The thickness of the fourth conductive film 422b is e.g. approximately 30 nm or more and 100 nm or less. This improves the effect of preventing short circuit between the third conductive film 422a and the second portion P2.

In the example shown in FIGS. 1 and 2, the first portion P1 is provided between the third region R3 and the second portion P2. The second portion P2 is provided adjacent to the first portion P1 in the X direction. Alternatively, the second portion P2 may be provided between the third region R3 and the first portion P1. The second portion P2 may be provided adjacent to the third region R3 in the Y direction.

Between the third region R3 and the fourth region R4, a fourth device isolation section T4 is provided. The fourth device isolation section T4 isolates the third region R3 from the fourth region R4. The fourth device isolation section T4 is made of e.g. $SiO_2$. The fourth device isolation section T4 has a fourth depth d4 in the Z direction from the reference position BS. For instance, the fourth depth d4 is the depth at the deepest position of the fourth device isolation section T4. The fourth depth d4 is deeper than the third depth d3. The fourth device isolation section T4 is formed deeper than the second device isolation section T2. The fourth depth d4 may be substantially equal to the third depth d3.

Between the extension electrode 52 and the second electrode 421, an interlayer insulating film 61 is provided. The interlayer insulating film 61 is provided from halfway the second region R2 to above the fourth device isolation section T4 in the X direction.

Because the first portion P1 is adjacent to the third region R3, the surface of the semiconductor substrate 10 is made flat from the third region R3 to the first portion P1. This avoids unnecessary step difference and achieves reduction in the area of the semiconductor memory device 110.

As shown in FIG. 4, in the semiconductor memory device 110 according to this embodiment, the first region R1 has a first surface f1. The first surface f1 is a surface of the semiconductor substrate 10 in the first region R1. The first insulating film 11 is provided in contact with the first surface f1. The second region R2 has a second surface f2. The second surface f2 is a surface of the semiconductor substrate 10 in the second region R2. The second surface f2 is a surface set back from the first surface f1. The position in the Z direction (height) of the second surface f2 is lower than the height of the first surface f1. The second insulating film 21 is provided in contact with the second surface f2.

The third region R3 has a third surface f3. The third surface f3 is a surface of the semiconductor substrate 10 in the third region R3. The third surface f3 is a surface set back from the second surface f2. The height of the third surface f3 is lower than the height of the second surface f2. The third insulating film 31 is provided in contact with the third surface f3.

The first portion P1 has a fourth surface f4. The fourth surface f4 is a surface of the semiconductor substrate 10 in the first portion P1. The fourth surface f4 is a surface set back from the second surface f2. The height of the fourth surface f4 is lower than the height of the second surface f2. The height of the fourth surface f1 may be substantially equal to the height of the third surface f3. The fourth insulating film 411 is provided in contact with the fourth surface f4.

The second portion P2 has a fifth surface f5. The fifth surface f5 is a surface of the semiconductor substrate 10 in the second portion P2. The fifth surface f5 is a surface set back from the first surface f1. The height of the fifth surface f5 is lower than the height of the first surface f1. The fifth insulating film 412 is provided in contact with the fifth surface f5.

The difference in height between the first surface f1 and the second surface f2 is substantially equal to the difference in height between the fifth surface f5 and the third surface f3.

The difference in height between the first surface f1 and the fifth surface f5 is substantially equal to the difference in height between the second surface f2 and the third surface f3.

The difference in height between the first surface f1 and the second surface f2 is substantially equal to the difference in height between the fifth surface f5 and the fourth surface f4.

The difference in height between the first surface f1 and the fifth surface f5 is substantially equal to the difference in height between the second surface f2 and the fourth surface f4.

The position of the upper surface of the third insulating film 31 is substantially equal to the position of the upper surface of the fourth insulating film 411.

The position of the upper surface of the third insulating film 31 is substantially equal to the position of the upper surface of the fifth insulating film 412.

In the semiconductor memory device 110 as described above, the height of the third surface f3 of the third region R3 provided with the guard ring GR is lower than the height of the first surface f1 and the height of the second surface f2. Thus, electrons causing noise are captured more efficiently. This stabilizes the potential of the semiconductor substrate 10, and achieves stabilization of the operation of the cell transistor Ctr.

Furthermore, in the semiconductor memory device 110, the depth d1 of the first device isolation section T1, the depth d2 of the second device isolation section T2, and the depth d3 of the third device isolation section T3 are made deeper in this order. The depth of the device isolation section is made deeper from the first region R1 to the third region R3. This suppresses application of local stress to the memory array MA.

Furthermore, in the semiconductor memory device 110, the first portion P1 is placed adjacent to the third region R3, and the height of the third surface f3 is made substantially equal to the height of the fourth surface f4. Then, no unnecessary step difference occurs from the third region R3 to the first portion P1. This achieves reduction in the area of the semiconductor memory device 110.

Furthermore, in the semiconductor memory device 110, the third device isolation section T3 is provided between the second surface f2 and the third surface f3. This relaxes abrupt change in height between the second surface f2 and the third surface f3. Thus, when an interlayer insulating film 32 is formed on the second region R2 and the third region R3, the influence of the underlying step difference is suppressed.

Second Embodiment

Next, a method for manufacturing a semiconductor memory device is described.

Figure 5:
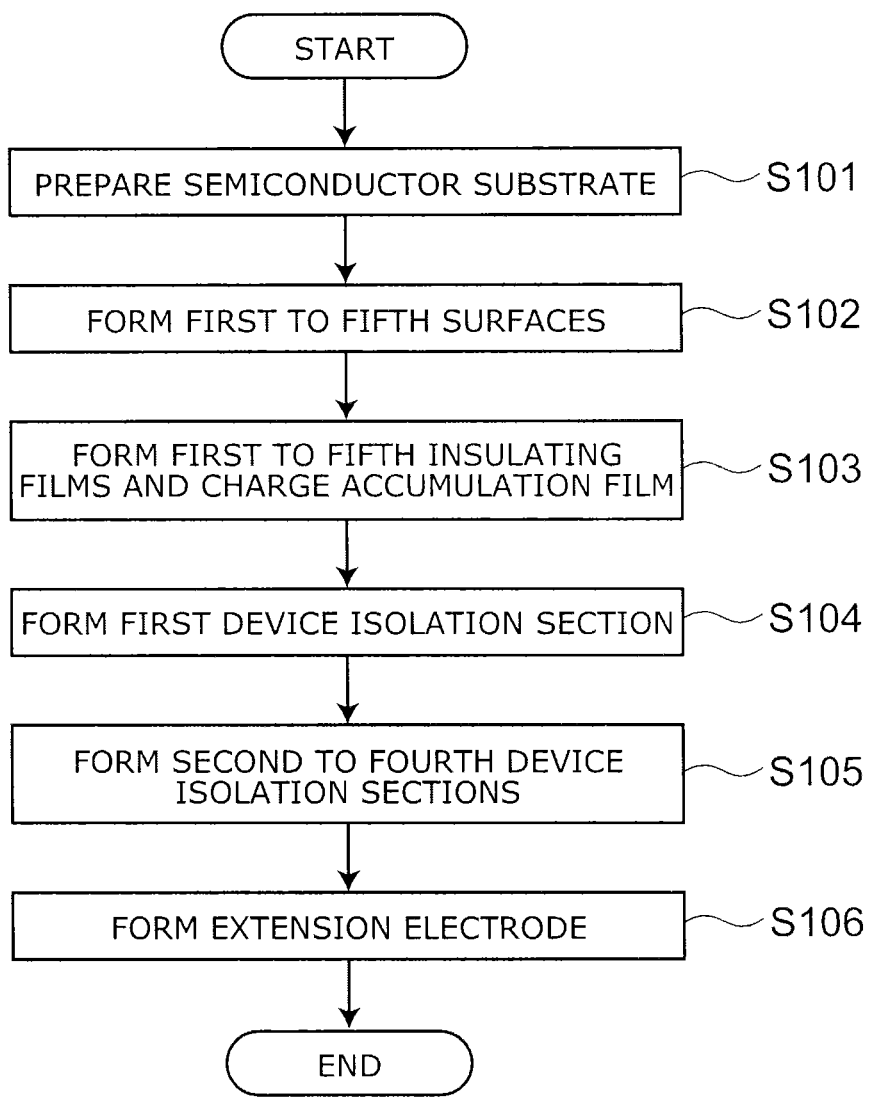
FIG. 5 is a flow chart illustrating a method for manufacturing a semiconductor memory device.

FIG. 5 is a flow chart illustrating the method for manufacturing a semiconductor memory device.

As shown in FIG. 5, the method for manufacturing a semiconductor memory device includes preparation of a semiconductor substrate (step S101), formation of first to fifth surfaces (step S102), formation of first to fifth insulating films and a charge storage film (step S103), formation of a first device isolation section (step S104), formation of second to fourth device isolation sections (step 5105), and formation of an extension electrode (step S106).

Next, a specific example of the manufacturing method including steps S101-S106 shown in FIG. 5 is described.

FIGS. 6A to 9C are schematic sectional views illustrating the method for manufacturing a semiconductor memory device.

Figure 6A:
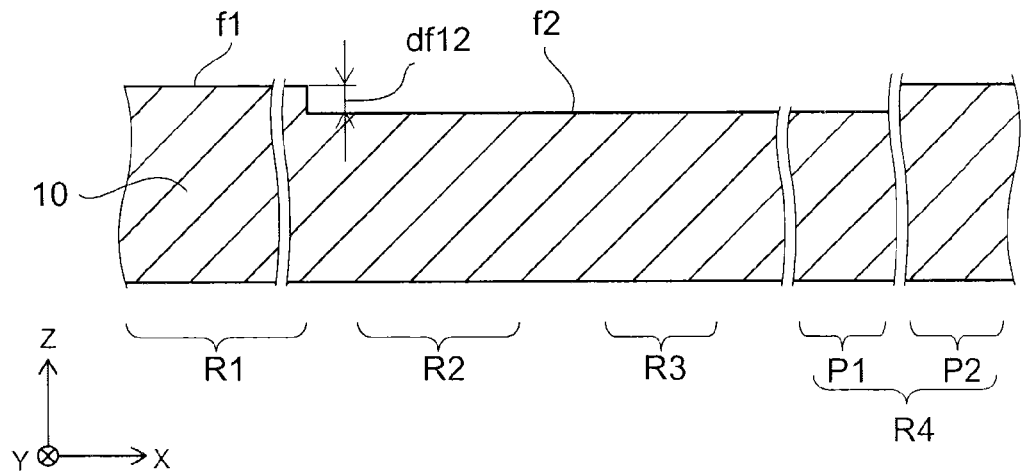
FIG. 6A to FIG. 9C are schematic cross-sectional views illustrating the method for manufacturing the semiconductor device.
Figure 6B:
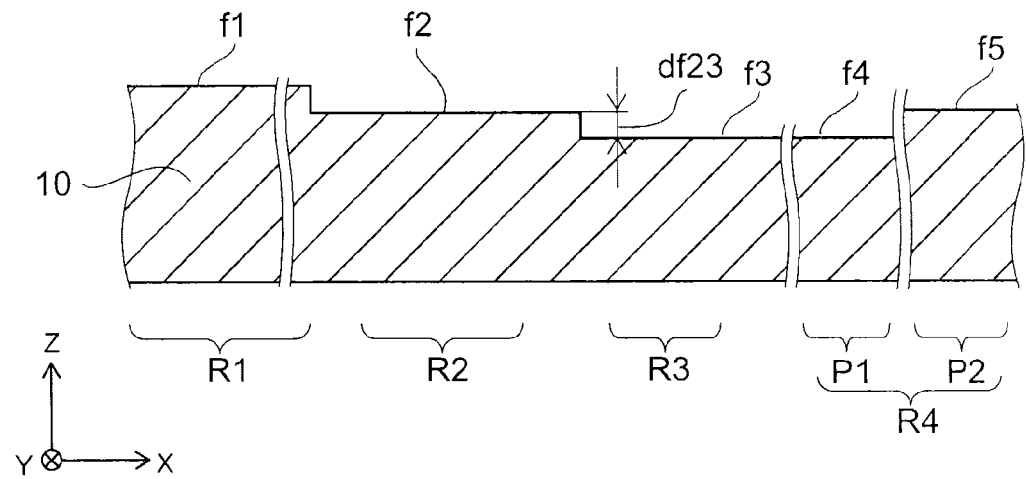
Figure 7:
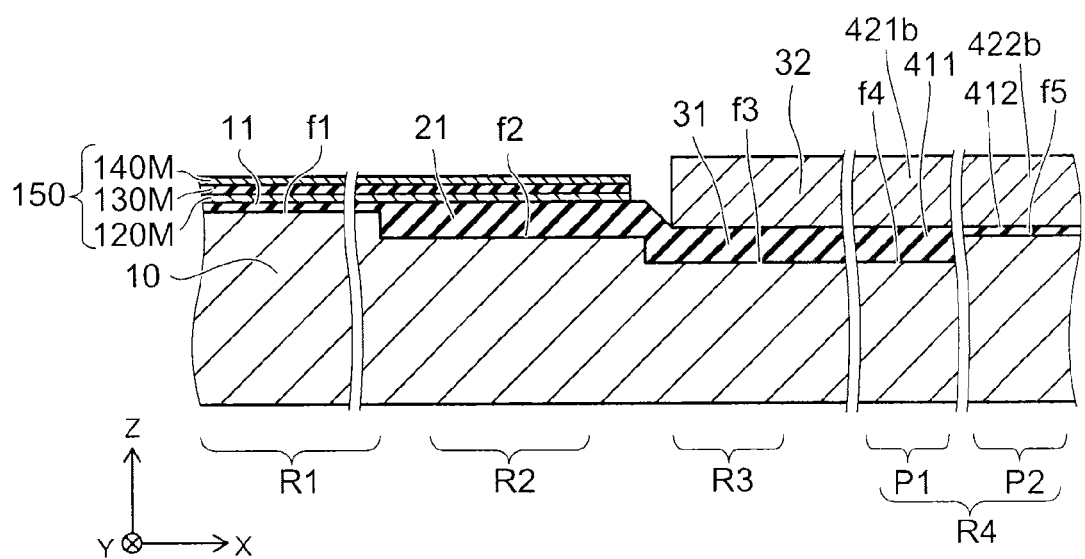

FIGS. 6A to 9C sequentially show the method for manufacturing the semiconductor memory device 110. FIGS. 6A and 6B correspond to steps S101-S102. FIG. 7 corresponds to step S103. FIG. 8A corresponds to steps S104-S105. FIG. 9B corresponds to step S106.

First, a semiconductor substrate 10 is prepared. The semiconductor substrate 10 includes e.g. Si. The semiconductor substrate 10 has a first region R1, a second region R2, a third region R3, and a fourth region R4. The fourth region R4 has a first portion P1 and a second portion P2.

Next, as shown in FIG. 6A, the substrate surface of the second region R2, the third region R3, and the first portion P1 of the semiconductor substrate 10 is set back. For instance, by photolithography and etching, part of the second region R2, the third region R3, and the first portion P1 is removed. Thus, a second surface f2 is formed as a substrate surface in the second region R2. The distance df12 in the Z direction between the first surface f1, being a substrate surface in the first region R1, and the second surface f2 is e.g. approximately 20 nm or more and 60 nm or less.

Next, as shown in FIG. 6B, the substrate surface of the third region R3 and the fourth region R4 (first portion P1 and second portion P2) is set back. For instance, by photolithography and etching, part of the third region R3 and the fourth region R4 is removed. Thus, a third surface f3 is formed as a substrate surface in the third region R3. In the first portion P1,
a fourth surface f4 having substantially the same height as the third surface f3 is formed as a substrate surface. The surface of the second portion P2 constitutes a fifth surface f5. The distance df23 in the Z direction between the second surface f2 and the third surface f3 is e.g. approximately 20 nm or more and 60 nm or less.

Next, as shown in FIG. 7, by e.g. photolithography and etching, a first insulating film 11, a second insulating film 21, a third insulating film 31, a fourth insulating film 411, and a fifth insulating film 412 are formed. Furthermore, by photolithography and etching, a stacked film 150 is formed on the first insulating film 11 and the second insulating film 21. The stacked film 150 includes e.g. a charge storage material film 120M, an intermediate insulating material film 130M, and a charge trap material film 140M. Furthermore, by photolithography and etching, a fifth conductive film 32, a second conductive film 421b, and a fourth conductive film 422b are formed on the third insulating film 31, the fourth insulating film 411, and the fifth insulating film 412.

The first insulating film 11, the second insulating film 21, the third insulating film 31, the fourth insulating film 411, and the fifth insulating film 412 are formed by e.g. thermal oxidation.

The charge storage material film 120M is made of e.g. polysilicon doped with impurity. The charge storage material film 120M is formed by e.g. CVD.

The intermediate insulating material film 130M is made of e.g. SiN. The intermediate insulating material film 130M is formed by e.g. CVD.

The charge trap material film 140M is made of e.g. a high dielectric insulating film. After the charge trap material film 140M is formed, heat treatment is performed.

The fifth conductive film 32, the second conductive film 421b, and the fourth conductive film 422b are made of e.g. polysilicon doped with impurity. The fifth conductive film 32, the second conductive film 421b, and the fourth conductive film 422b are formed by e.g. CVD (chemical vapor deposition). The thickness of the fifth conductive film 32, the thickness of the second conductive film 421b, and the thickness of the fourth conductive film 422b are each e.g. approximately 30 nm or more and 100 nm or less.

Next, as shown in FIG. 7, part of the stacked film 150 made of the charge storage material film 120M, the intermediate insulating material film 130M, and the charge trap material film 140M is removed. For instance, by photolithography and etching, while leaving part of the stacked film 150 provided from above the first region R1 to above part of the second region R2, the other portion of the stacked film 150 is removed.

Figure 8A:
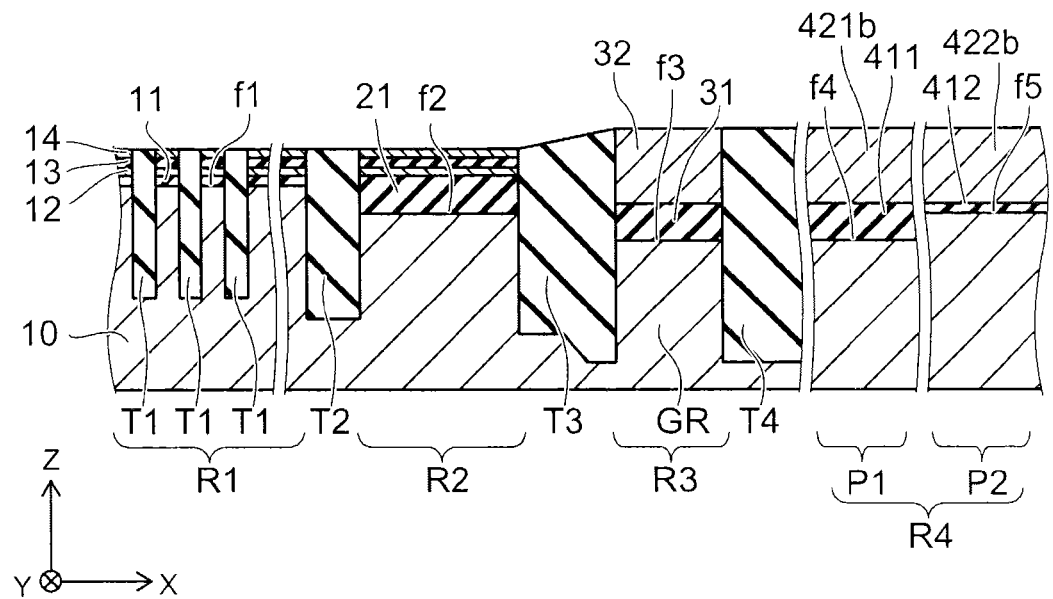

Next, as shown in FIG. 8A, a first device isolation section T1, a second device isolation section T2, a third device isolation section T3, and a fourth device isolation section T4 are formed. In forming a first device isolation section T1, first, the stacked film 150, the insulating film 11, and the semiconductor substrate 10 are selectively removed to form a trench. The trench is formed by e.g. RIE (Reactive Ion Etching). Then, an insulating material is embedded into the trench. Thus, a first device isolation section T1 is formed. By the formation of the first device isolation section T1, the stacked film 150 is divided to form a charge storage film 12, an intermediate insulating film 13, and a charge trap film 14 for each of a plurality of memory cells MC.

In forming a second device isolation section T2, first, the stacked film 150, the first insulating film 11, the second insulating film 21, and the semiconductor substrate 10 are selectively removed to form a trench between the first region R1 and the second region R2. The trench is formed by e.g. RIE. Then, an insulating material is embedded into the trench.

In forming a third device isolation section T3, first, the stacked film 150, the fifth conductive film 32, the third insulating film 31, and the semiconductor substrate 10 are selectively removed to form a trench between the second region R2 and the third region R3. The trench is formed by e.g. RIE. Then, an insulating material is embedded into the trench. The formation of the third device isolation section T3 relaxes abrupt change in height between the second surface f2 and the third surface f3.

In forming a fourth device isolation section T4, first, the fifth conductive film 32, the second conductive film 421b, the fourth insulating film 411, and the semiconductor substrate 10 are selectively removed to form a trench between the third region R3 and the fourth region R4. The trench is formed by e.g. RIE. Then, an insulating material is embedded into the trench. The third region R3 between the third device isolation section T3 and the fourth device isolation section T4 forms a guard ring GR.

Figure 8B:
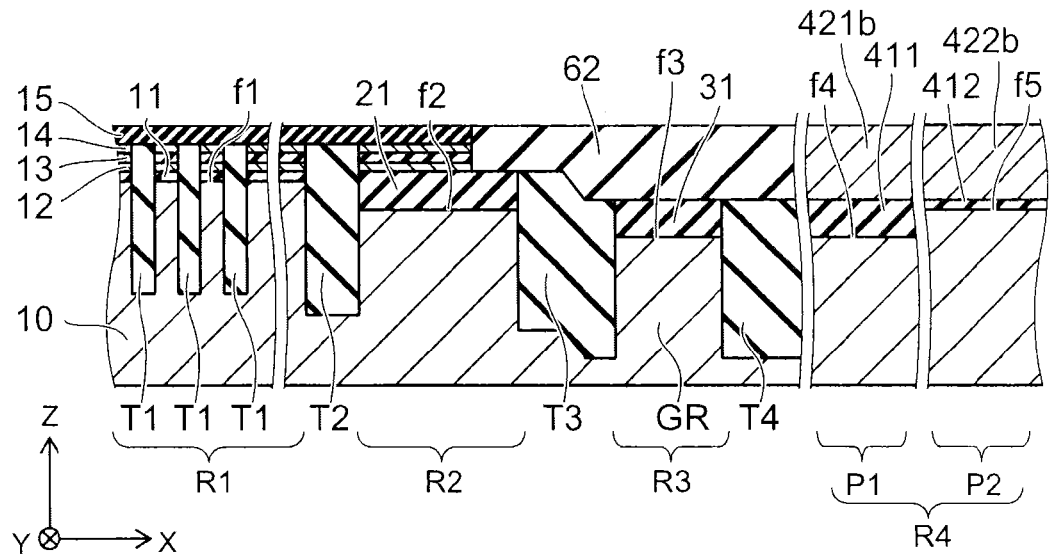

Next, as shown in FIG. 8B, an intergate insulating film 15 is formed. The intergate insulating film 15 is made of e.g. silicon oxide or alumina. The intergate insulating film 15 is provided from above the first region R1 to above the stacked film 150 provided on the second region R2. On the intergate insulating film 15, a stopper film (e.g., SiN film), not shown, is formed. Furthermore, an interlayer insulating film 62 is formed between the intergate insulating film 15 and the second conductive film 421b.

Figure 9A:
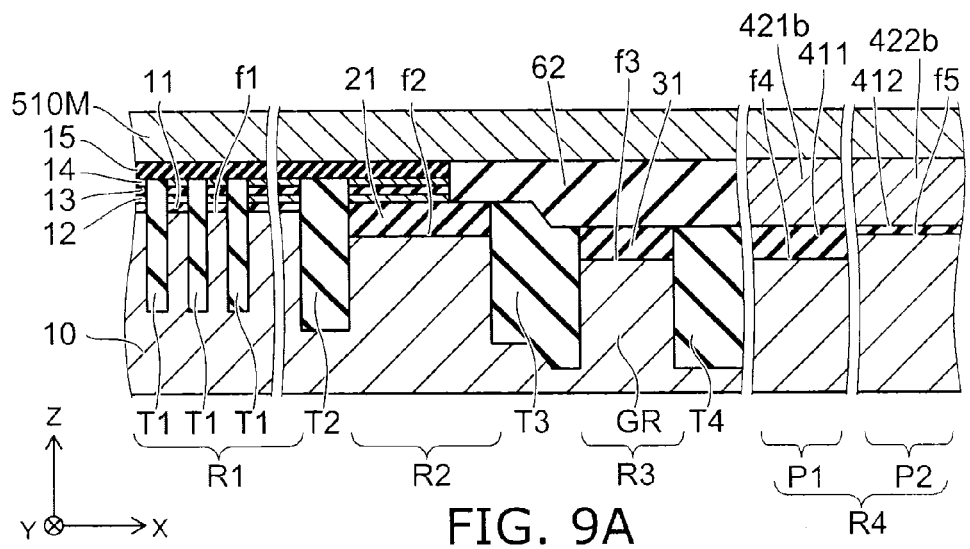

Next, as shown in FIG. 9A, a first electrode material film 510M is formed. The first electrode material film 510M is made of e.g. polysilicon, WSi (tungsten silicide), CoSi (cobalt silicide), NiSi (nickel silicide), W, a stacked film of W and polysilicon, or a stacked film of W and WN.

Figure 9B:
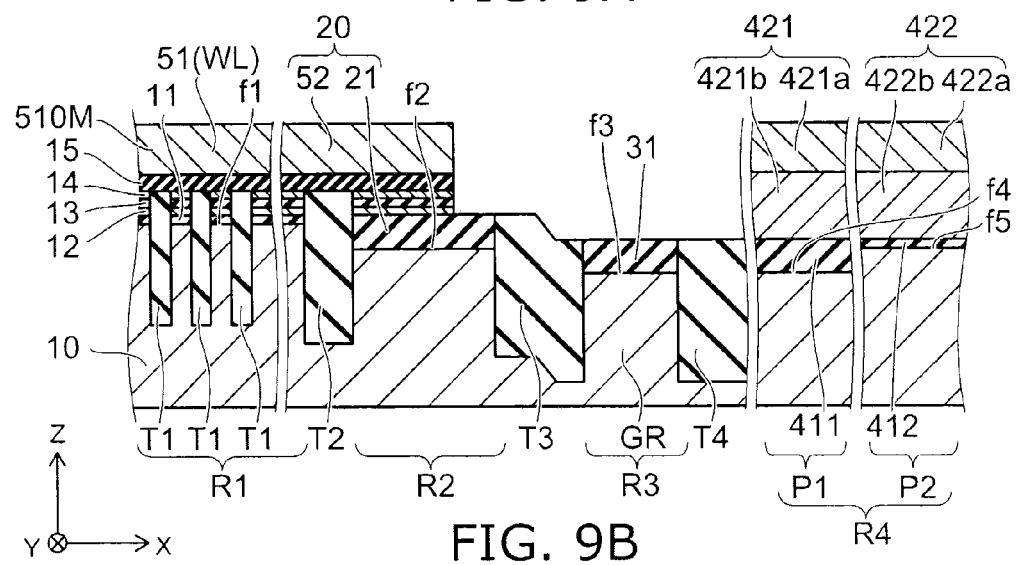

Next, as shown in FIG. 9B, part of the first electrode material film 510M is removed. Thus, a first electrode 51, an extension electrode 52, a first conductive film 421a, and a third conductive film 422a are formed.

Figure 9C:
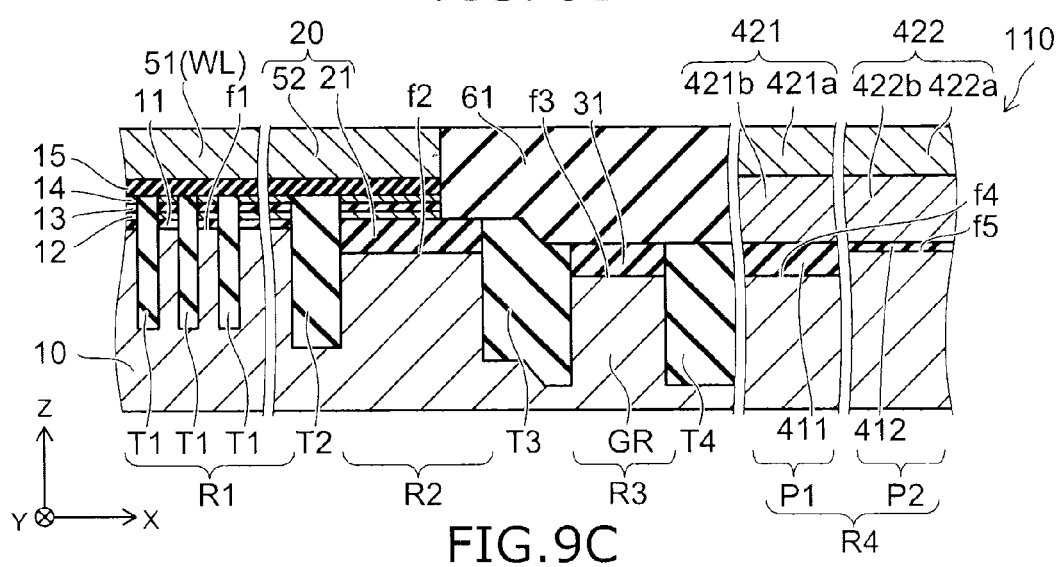

Then, as shown in FIG. 9C, an insulating material of an interlayer insulating film 61 is embedded into the portion from which the first electrode material film 510M has been removed. Thus, the semiconductor memory device 110 is completed.

In the method for manufacturing the semiconductor memory device 110 as described above, the interlayer insulating film 32 is less susceptible to the difference in height between the second surface f2 and the third surface f3. This improves the reliability of the interlayer insulating film 32 and the film formed thereon. Thus, the film formed on the third region R3 and the first portion P1 is not affected by the underlying step difference. This improves the reliability of the film formed on the third region R3 and the first portion P1.

As described above, in the semiconductor memory device according to the embodiments, the reliability can be improved.

The embodiments have been described above. However, the invention is not limited to the above examples. For instance, the above embodiments illustrate a floating gate electrode in which a conductive material is used for the charge storage film 12. However, an insulating material may be used for the charge storage film 12. For instance, the semiconductor memory device may be configured as a MONOS (metal-oxide-nitride-oxide-silicon) memory device. Furthermore, those skilled in the art can modify the above embodiments by suitable addition, deletion, and design change of components, and by suitable combination of the features of the embodiments. Such modifications are also encompassed within the scope of the invention as long as they fall within the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a semiconductor substrate including a first region, a second region, a third region, and a fourth region, the second region being provided between the first region and the third region, the third region being provided between the second region and the fourth region, and the fourth region including a first portion and a second portion;
   a cell transistor provided on the first region and including a first insulating film having a first film thickness, a charge storage film provided on the first insulating film, and a first electrode provided on the charge storage film;
   an extraction section provided on the second region and including a second insulating film having a second film thickness thicker than the first film thickness, and an extension electrode provided on the second insulating film, being continuous with the first electrode, and extending from above the first region to above the second region;
   a guard ring provided on the third region and including a third insulating film having a third film thickness thicker than the first film thickness;
   a first transistor provided on the first portion and including a fourth insulating film having a fourth film thickness thicker than the first film thickness, and a second electrode provided on the fourth insulating film;
   a second transistor provided on the second portion and including a fifth insulating film having a fifth film thickness thinner than the fourth film thickness, and a third electrode provided on the fifth insulating film;
   a first device isolation section provided in the first region;
   a second device isolation section provided between the first region and the second region;
   a third device isolation section provided between the second region and the third region; and
   a fourth device isolation section provided between the third region and the fourth region,
   wherein
   the first device isolation section has a first depth when a surface of the semiconductor substrate in the first region is used as a reference position,
   the second device isolation section has a second depth deeper than the first depth as viewed from the reference position,
   the third device isolation section has a third depth deeper than the second depth as viewed from the reference position, and
   the fourth device isolation section has a fourth depth deeper than the second depth as viewed from the reference position.

2. The device according to claim 1, wherein
   the third film thickness is substantially equal to the second film thickness, and the fourth film thickness is substantially equal to the second film thickness.

3. The device according to claim 1, wherein the depth of the third device isolation section is deeper on a side of the third region than on a side of the second region.

4. The device according to claim 1, wherein an upper surface of the third device isolation section is set back further on a side of the third region than on a side of the second region.

5. The device according to claim 1, wherein the first portion is adjacent to the third region.

6. The device according to claim 1, wherein the guard ring is provided so as to surround a region including the first region and the second region.

7. The device according to claim 1, wherein
the second electrode includes a first conductive film, and a second conductive film provided between the first conductive film and the fourth insulating film, and
the third electrode includes a third conductive film, and a fourth conductive film provided between the third conductive film and the fifth insulating film.

8. A semiconductor memory device comprising:
a semiconductor substrate including a first region, a second region, a third region, and a fourth region, the second region being provided between the first region and the third region, the third region being provided between the second region and the fourth region, and the fourth region including a first portion and a second portion;
a cell transistor provided on the first region and including a first insulating film having a first film thickness, a charge storage film provided on the first insulating film, and a first electrode provided on the charge storage film;
an extraction section provided on the second region and including a second insulating film having a second film thickness thicker than the first film thickness, and an extension electrode provided on the second insulating film, being continuous with the first electrode, and extending from above the first region to above the second region;
a guard ring provided on the third region and including a third insulating film having a third film thickness thicker than the first film thickness;
a first transistor provided on the first portion and including a fourth insulating film having a fourth film thickness thicker than the first film thickness, and a second electrode provided on the fourth insulating film; and
a second transistor provided on the second portion and including a fifth insulating film having a fifth film thickness thinner than the fourth film thickness, and a third electrode provided on the fifth insulating film;
wherein
a surface of the semiconductor substrate in the second region is set back from a surface of the semiconductor substrate in the first region,
a surface of the semiconductor substrate in the third region is set back from the surface of the semiconductor substrate in the second region,
a surface of the semiconductor substrate in the first portion is set back from the surface of the semiconductor substrate in the second region,
a surface of the semiconductor substrate in the second portion is set back from the surface of the semiconductor substrate in the first region, and
the first insulating film, the second insulating film, the third insulating film, the fourth insulating film, and the fifth insulating film are provided in contact with the surface of the semiconductor substrate.

9. The device according to claim 8, wherein a difference in a height between the surface of the semiconductor substrate in the first region and the surface of the semiconductor substrate in the second region is substantially equal to a difference in a height between the surface of the semiconductor substrate in the second portion and the surface of the semiconductor substrate in the third region.

10. The device according to claim 8, wherein a difference in a height between the surface of the semiconductor substrate in the first region and the surface of the semiconductor substrate in the second portion is substantially equal to a difference in a height between the surface of the semiconductor substrate in the second region and the surface of the semiconductor substrate in the third region.

11. The device according to claim 8, wherein a height of the surface of the semiconductor substrate in the third region is substantially equal to a height of the surface of the semiconductor substrate in the first portion.

12. The device according to claim 8, wherein a difference in a height between the surface of the semiconductor substrate in the first region and the surface of the semiconductor substrate in the second region is substantially equal to a difference in a height between the surface of the semiconductor substrate in the second portion and the surface of the semiconductor substrate in the first portion.

13. The device according to claim 8, wherein a difference in a height between the surface of the semiconductor substrate in the first region and the surface of the semiconductor substrate in the second portion is substantially equal to a difference in a height between the surface of the semiconductor substrate in the second region and the surface of the semiconductor substrate in the first portion.

14. The device according to claim 8, wherein a position of an upper surface of the first insulating film is substantially equal to a position of an upper surface of the second insulating film.

15. The device according to claim 8, wherein a position of an upper surface of the third insulating film is substantially equal to a position of an upper surface of the fourth insulating film.

16. The device according to claim 8, wherein
a position of an upper surface of the third insulating film is substantially equal to a position of an upper surface of the fourth insulating film, and
the position of the upper surface of the third insulating film is substantially equal to a position of an upper surface of the fifth insulating film.

17. The device according to claim 8, wherein
the third film thickness is substantially equal to the second film thickness, and
the fourth film thickness is substantially equal to the second film thickness.

18. The device according to claim 8, wherein the first portion is adjacent to the third region.

19. The device according to claim 8, wherein the guard ring is provided so as to surround a region including the first region and the second region.

20. The device according to claim 8, wherein
the second electrode includes a first conductive film, and a second conductive film provided between the first conductive film and the fourth insulating film, and
the third electrode includes a third conductive film, and a fourth conductive film provided between the third conductive film and the fifth insulating film.

* * * * *